(12) United States Patent
Hsu

(10) Patent No.: US 11,917,754 B2
(45) Date of Patent: Feb. 27, 2024

(54) ANTENNA MODULE WITH KEEP-OUT AREA

(71) Applicant: INDUSTRIAL TECHNOLOGY RESEARCH INSTITUTE, Hsinchu (TW)

(72) Inventor: Chien-Min Hsu, Hsinchu County (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 67 days.

(21) Appl. No.: 17/498,606

(22) Filed: Oct. 11, 2021

(65) Prior Publication Data

US 2022/0400549 A1 Dec. 15, 2022

(30) Foreign Application Priority Data

Jun. 9, 2021 (TW) .................... 110121082

(51) Int. Cl.
| | |
|---|---|
| *H05K 1/05* | (2006.01) |
| *H01Q 1/24* | (2006.01) |
| *H05K 1/18* | (2006.01) |
| *H01Q 1/38* | (2006.01) |
| *H05K 1/02* | (2006.01) |
| *H01Q 9/42* | (2006.01) |
| *H01Q 1/48* | (2006.01) |
| *H01Q 23/00* | (2006.01) |

(52) U.S. Cl.
CPC .............. *H05K 1/05* (2013.01); *H01Q 1/241* (2013.01); *H01Q 1/38* (2013.01); *H01Q 9/42* (2013.01); *H05K 1/0281* (2013.01); *H05K 1/189* (2013.01); *H01Q 1/48* (2013.01); *H01Q 23/00* (2013.01); *H05K 2201/10098* (2013.01)

(58) Field of Classification Search
CPC ..................... H05K 1/05; H05K 1/189; H05K 2201/10098; H01Q 1/241; H01Q 1/48; H01Q 23/00; H01Q 1/085; H01Q 1/38; H01Q 9/42; H01Q 1/273
See application file for complete search history.

(56) References Cited

U.S. PATENT DOCUMENTS

| | | | |
|---|---|---|---|
| 9,160,056 B2 | 10/2015 | Nickel | |
| 9,257,750 B2 | 2/2016 | Vazquez | |
| (Continued) | | | |

FOREIGN PATENT DOCUMENTS

| | | |
|---|---|---|
| CN | 1391416 A | 1/2003 |
| CN | 105119046 A | 12/2015 |
| (Continued) | | |

OTHER PUBLICATIONS

Taiwan Office Action dated May 4, 2022 as received in application No. 110121082.

(Continued)

*Primary Examiner* — Hoang V Nguyen
*Assistant Examiner* — Yonchan J Kim
(74) *Attorney, Agent, or Firm* — Maschoff Brennan

(57) ABSTRACT

An antenna module comprises: a circuit board, having a three-dimensional keep-out area; an antenna, disposed on the circuit board and located in the keep-out area; and a metal piece, disposed on the circuit board and located in the keep-out area, wherein the metal piece is electrically insulated from the antenna.

10 Claims, 5 Drawing Sheets

(56) References Cited

U.S. PATENT DOCUMENTS

| | | | |
|---|---|---|---|
| 2011/0037680 A1 | 2/2011 | Chiu | |
| 2012/0285611 A1* | 11/2012 | Desclos | H01Q 1/40 |
| | | | 156/222 |
| 2014/0340265 A1* | 11/2014 | Vazquez | H01Q 1/243 |
| | | | 343/702 |
| 2019/0081389 A1* | 3/2019 | Tsai | H01Q 1/38 |
| 2022/0069439 A1* | 3/2022 | Kuo | H01Q 9/0407 |

FOREIGN PATENT DOCUMENTS

| | | | | |
|---|---|---|---|---|
| CN | 105356033 A | | 2/2016 | |
| CN | 111541003 A | | 8/2020 | |
| TW | 200731919 A | | 8/2007 | |
| TW | 200913382 A | * | 3/2009 | ............ H01Q 1/007 |
| TW | 200913382 A | | 3/2009 | |
| TW | 201735442 | | 10/2017 | |

OTHER PUBLICATIONS

Taiwan Office Action dated Oct. 4, 2022 as received in application No. 110121082.
Taiwan Office Action dated Feb. 18, 2023 as received in application No. 110121082.

* cited by examiner

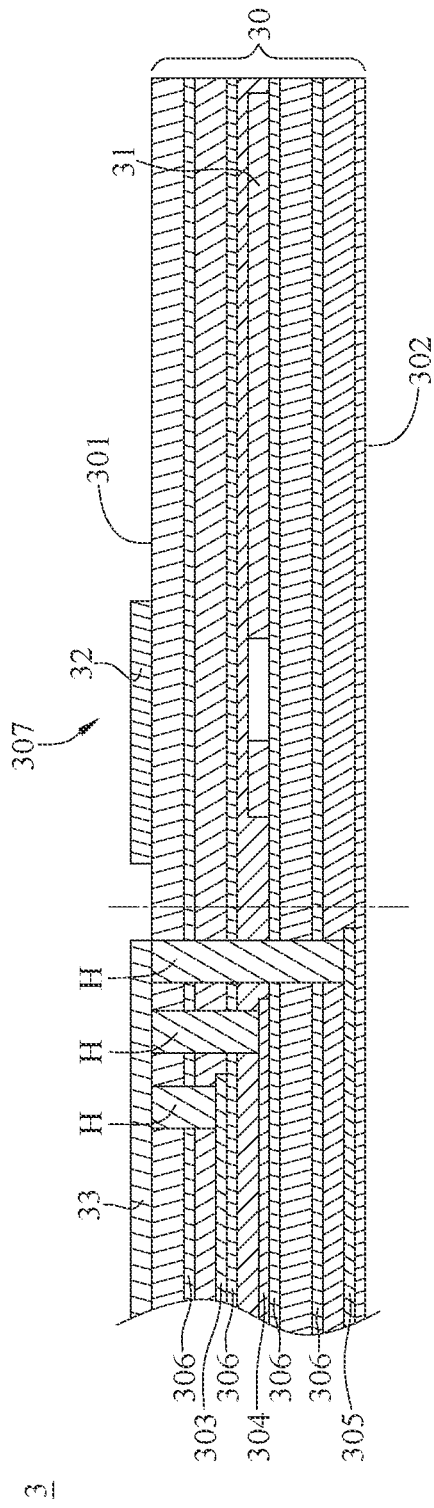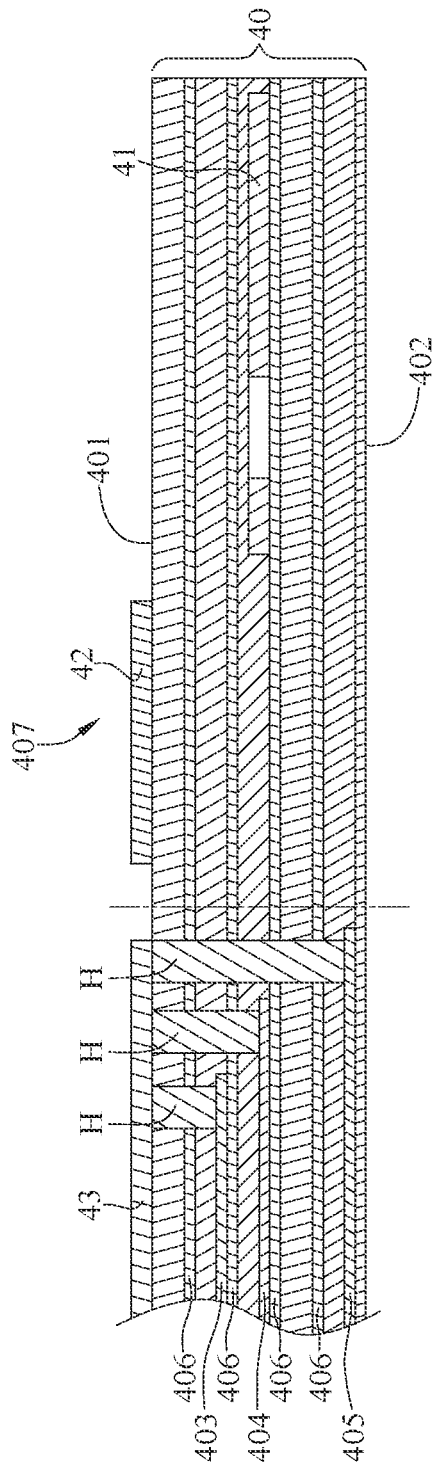

ANTENNA MODULE WITH KEEP-OUT AREA

CROSS-REFERENCE TO RELATED APPLICATIONS

This non-provisional application claims priority under 35 U.S.C. § 119(a) on Patent Application No(s). 110121082 filed in Republic of China (ROC) on Jun. 9, 2021, the entire contents of which are hereby incorporated by reference.

TECHNICAL FIELD

This disclosure relates to an antenna module, and relates to an antenna module that is able to ease the problem of frequency band drifting.

BACKGROUND

As modern people pay more and more attention to the quality of life as well as the aging of population, many wearable sensing devices have also emerged. The wearable sensing device may be applied to the medical care and physiological monitoring of the elderly, or to monitor the physiological status of young people such as breathing, heartbeats, exercise posture, or calorie consumption during exercise. Since the sensed data has to be transmitted wirelessly, the wearable sensing devices requires an antenna.

A conventional rigid printed circuit board (PCB) antenna module is quite hard and not easy to bend. If the antenna module is worn by a person, it will protrude out of the clothing and cause a lot of inconvenience. Therefore, the antenna module used for wearable sensing device is usually integrated onto a flexible circuit board or fabrics for a user to wear. However, when the antenna module is bent due to external forces, the frequency band of the antenna is constantly drifted and thereby reducing the transmission efficiency of the antenna.

SUMMARY

According to one or more embodiment of this disclosure, an antenna module comprises: a circuit board, having a three-dimensional keep-out area; an antenna, disposed on the circuit board and located in the keep-out area; and a metal piece, disposed on the circuit board and located in the keep-out area, wherein the metal piece is electrically insulated from the antenna.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein:

FIG. 5 is a cross sectional view of an antenna module according to a third embodiment of the present disclosure;

FIG. 6 is a cross sectional view of an antenna module according to a fourth embodiment of the present disclosure;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Various embodiments of the antenna module of the present disclosure may be applied to various kinds of wearable devices, such as headscarves or bracelets, or combined with the clothes, pants or shoes of the user.

Accordingly, this disclosure provides an antenna module that is able to ease the problem of frequency band drifting.

Figure 1:
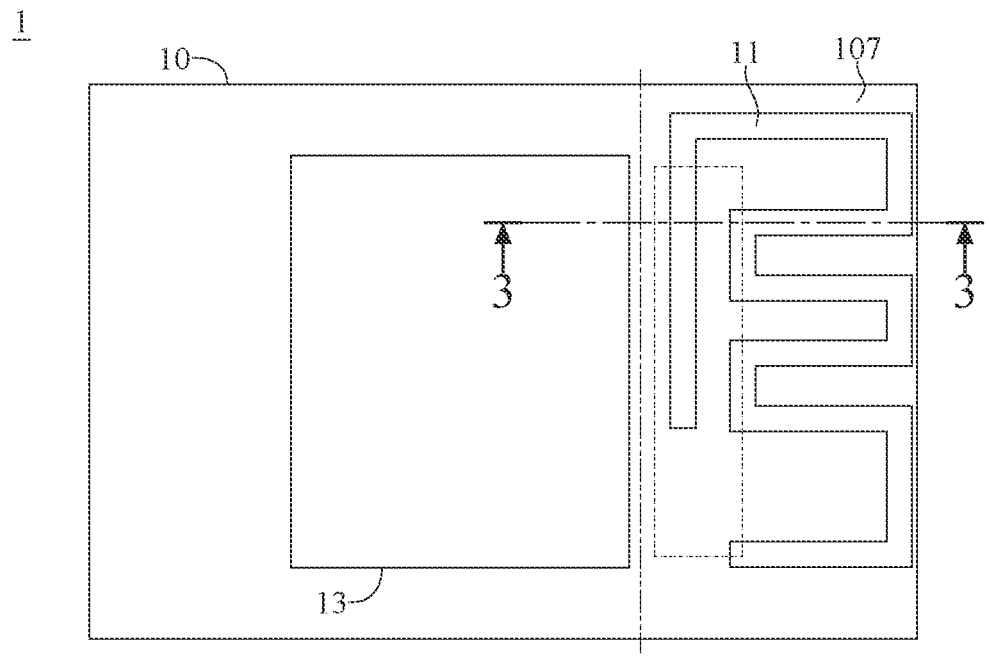
FIG. 1 is a schematic diagram of a top view of an antenna module according to a first embodiment of the present disclosure.
Figure 2:
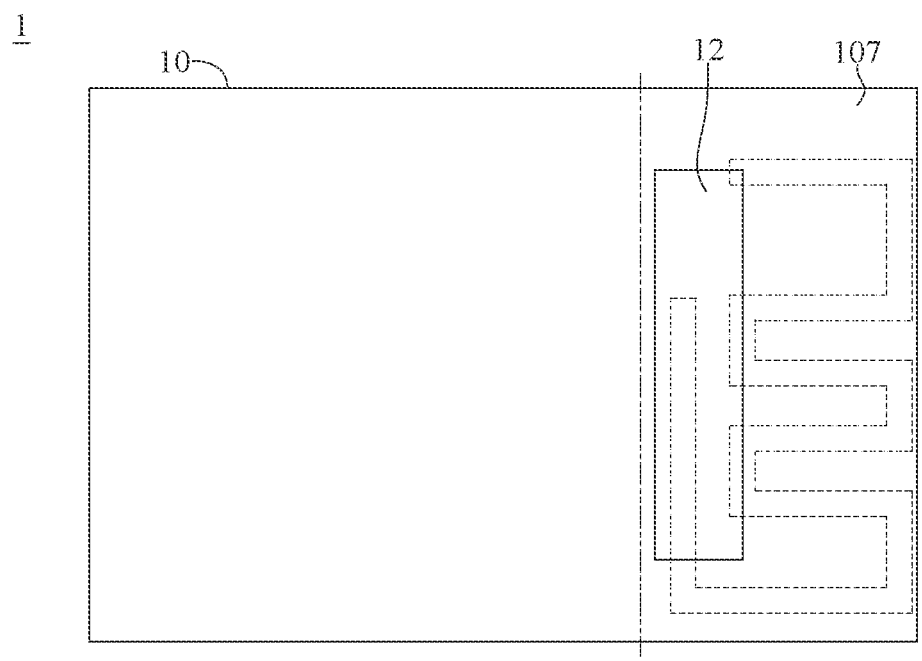
FIG. 2 is a schematic diagram of a bottom view of the antenna module according to the first embodiment of the present disclosure.
Figure 3:
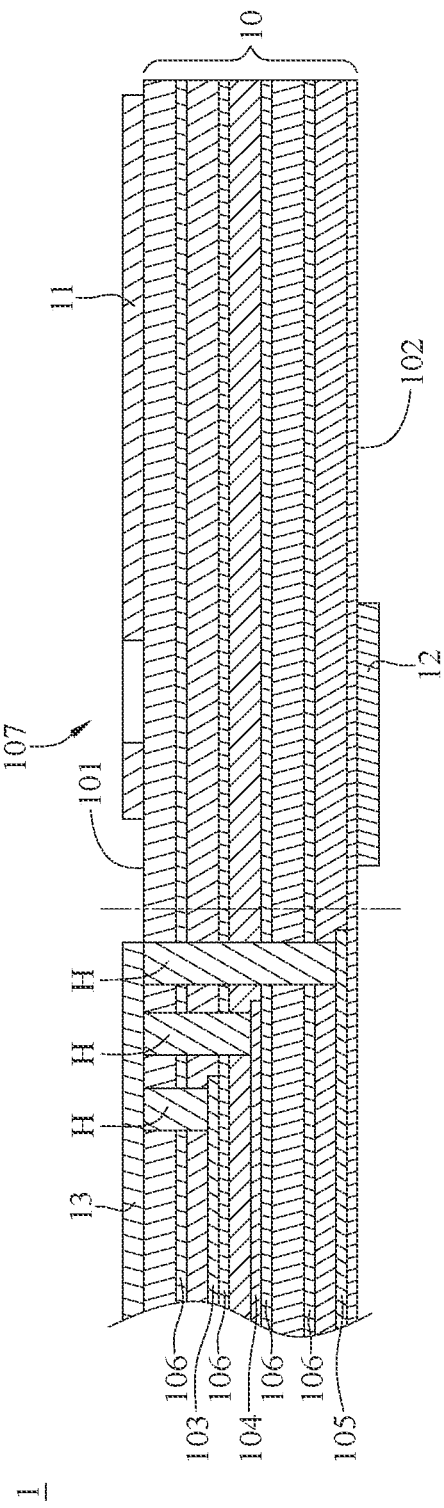
FIG. 3 is a cross sectional view of the alone the line 3-3 of the antenna module of FIG. 1.

FIG. 1 is a schematic diagram of a top view of an antenna module according to a first embodiment of the present disclosure; FIG. 2 is a schematic diagram of a bottom view of the antenna module according to the first embodiment of the present disclosure; and FIG. 3 is a cross sectional view of the alone the line 3-3 of the antenna module of FIG. 1. Please refer to FIGS. 1-3 together, the antenna module comprises a circuit board 10, an antenna 11, a metal piece and a driving chip 13. The circuit board 10 is a flexible multilayer printed circuit board, and the antenna 11 is formed on the printed circuit board. The circuit board 10 comprises an upper surface 101, a lower surface 102, a power layer 103, a signal wire layer 104 and a ground layer 105. The upper surface 101 and the lower surface 102 are spaced apart from each other along a direction perpendicular to the upper surface 101. The power layer 103, the signal wire layer 104 and the ground layer 105 locates between the upper surface 101 and the lower surface 102 and respectively locates on different layers of the circuit board 10, and an insulating layer 106 is disposed between different layers of the circuit board 10 that are adjacent to each other. The driving chip 13 is disposed on the upper surface 101 of the circuit board 10, and the power layer 103, the signal wire layer 104 and the ground layer 105 are electrically connected to different pins of the driving chip 13 respectively through a through hole H filled with metal materials. The circuit board 10 further has a keep-out area 107, and the keep-out area 107 extends from the upper surface 101 to the lower surface 102 in a direction perpendicular to the upper surface 101.

As shown in FIG. 3, the keep-out area 107 is a three dimensional area, wherein the three dimensional area indicates that the keep-out area 107 is an area with three dimensions: length, width and height. In this embodiment, the antenna 11 is a printed circuit antenna, and the antenna 11 is disposed on the upper surface 101 of the circuit board 10 and is electrically connected to the driving chip 13. The antenna 11 locates in the keep-out area 107. Since none of the wires for currents to flow through may be disposed in the keep-out area 107 except for the antenna 11, the area size of the keep-out area 107 may be adjusted according to the area size of the antenna 11. Therefore, the area of the circuit board 10 other than the keep-out area 107 may be efficiently used for the circuit layout. Specifically, when the area size of the antenna 11 increase, the volume of the keep-out area 107 also increases. When the area size of the antenna 11 decreases, the volume of the keep-out area 107 also decreases. Generally, a shape of a projection of the upper surface 101 or the lower surface 102 on the keep-out area 107 is a rectangle slightly larger than the antenna 11, that is, the keep-out area 107 is a cuboid. However, the shape of the projection of the upper surface 101 or the lower surface 102 on the keep-out area 107 is not limited to rectangle, the projection may also be other shapes, for the antenna 11 to completely located within the keep-out area 107.

In addition, the antenna 11 shown in FIG. 1 is an embodiment, the antenna module 1 of the present disclosure may also use other types of antenna, and is not limited to the antenna 11 shown in FIG. 1. Further, a circuit shape of the printed circuit antenna in the antenna module 1 may be a meandering line, but is not limited thereto.

As shown in FIGS. 2 and 3, the metal piece 12 is a cuboid and locates in the keep-out area 107. Further, the metal piece 12 is disposed on the lower surface 102 of the circuit board 10 and is electrically insulated from the antenna 11. Moreover, no electric current can be introduced into the metal piece 12, and the metal piece 12 located in the keep-out area 107 is electrically insulated from any conductive wires outside the keep-out area 107 used for introducing current. In the present embodiment, wires outside the keep-out area 107 used for introducing current are, respectively, the power layer 103, the signal wire layer 104 and the ground layer 105. Therefore, the metal piece 12 is further electrically insulated from the power layer 103, the signal wire layer 104 and the ground layer 105. The projection of the antenna 11 along the direction perpendicular to the upper surface 101 overlaps the metal piece 12. Further, the circuit board shown by the embodiment of FIG. 3 has six layers, but the number of layers of the circuit board is not limited to six.

In addition, the metal piece 12 shown in FIGS. 2 and 3 is an embodiment, the antenna module of the present disclosure may also use a metal piece with different shapes and is not limited to the metal piece 12 shown in FIGS. 2 and 3.

Figure 4:
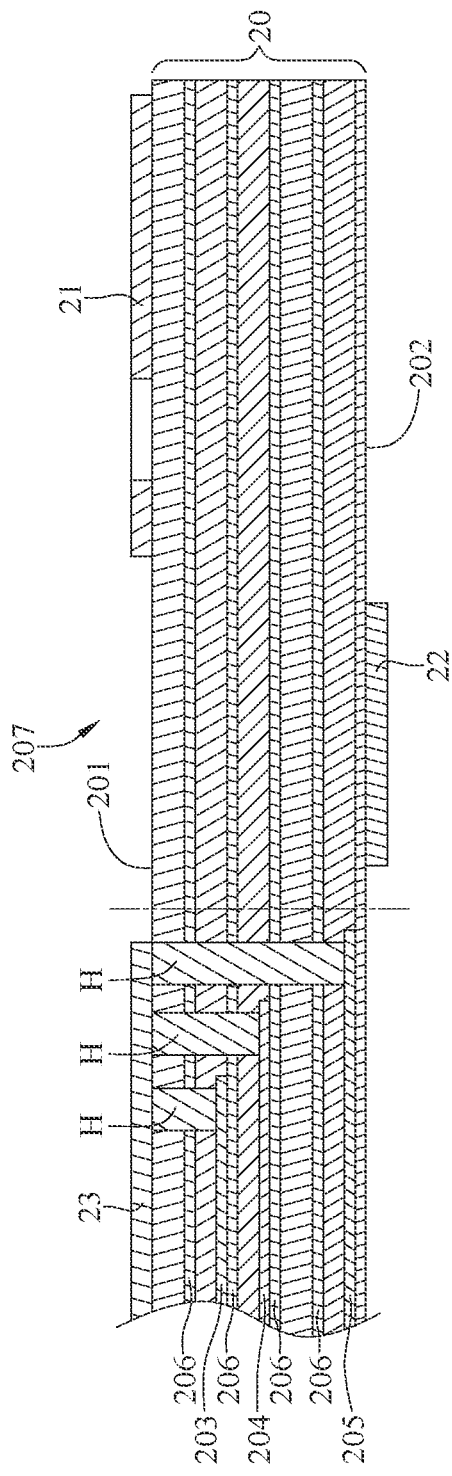
FIG. 4 is a cross sectional view of an antenna module according to a second embodiment of the present disclosure.

FIG. 4 is a cross sectional view of an antenna module according to a second embodiment of the present disclosure. As shown by FIG. 4, the antenna module 2 comprises a circuit board 20, an antenna 21, a metal piece 22 and a driving chip 23. The circuit board 20 comprises an upper surface 201, a lower surface 202, a power layer 203, a signal wire layer 204, a ground layer 205, a plurality of insulating layers 206 and a keep-out area 207.

Specifically, the antenna module 2 of the second embodiment is similar to the antenna module 1 of the first embodiment. The difference lies in that, the projection of the antenna 21 along a direction perpendicular to the upper surface 201 does not overlap the metal piece 22. That is, the metal piece 22 and the projection of the antenna 21 in the direction perpendicular to the upper surface 201 are misaligned. The detail structure of the antenna module 2 is described as follow. The upper surface 201 and the lower surface 202 are spaced apart from each other along a direction perpendicular to the upper surface 201, and the power layer 203, the signal wire layer 204 and the ground layer 205 are located between the upper surface 201 and the lower surface 202. The power layer 203, the signal wire layer 204 and the ground layer 205 are respectively located on different layers of the circuit board 20, and the insulating layers 206 are respectively disposed between the different layers of the circuit board 20. The keep-out area 207 extends from the upper surface 201 to the lower surface 202 in a direction perpendicular to the upper surface 201, and a part of the circuit board 20 locates in the keep-out area 207. The antenna 21 is disposed in the upper surface 201 of the circuit board 20 and locates in the keep-out area 207. The antenna 21 is electrically connected to the driving chip 23. The metal piece 22 is disposed on the lower surface 201 of the circuit board 20 and locates in the keep-out area 207. The metal piece 22 is electrically insulated from the antenna 21, and no current can be introduced into the metal piece 22. Further, the metal piece 22 located in the keep-out area 207 is electrically insulated from any conductive wires outside the keep-out area 107 used for introducing current. In the present embodiment, wires used for introducing current outside the keep-out area 207 are, respectively, the power layer 203, the signal wire layer 204 and the ground layer 205. Therefore, the metal piece 22 is further electrically insulated from the power layer 203, the signal wire layer 204 and the ground layer 205.

FIG. 5 is a cross sectional view of an antenna module according to a third embodiment of the present disclosure. As shown by FIG. 5, the antenna module 3 comprises a circuit board 30, an antenna 31, a metal piece 32 and a driving chip 33. The circuit board 30 comprises an upper surface 301, a lower surface 302, a power layer 303, a signal wire layer 304, a ground layer 305, a plurality of insulating layers 306 and a keep-out area 307. The upper surface 301 and the lower surface 302 are spaced apart from each other along a direction perpendicular to the upper surface 301, and the power layer 303, the signal wire layer 304 and the ground layer 305 are located between the upper surface 301 and the lower surface 302. The power layer 303, the signal wire layer 304 and the ground layer 305 are respectively located on different layers of the circuit board 30, and the insulating layers 306 are respectively disposed between the different layers of the circuit board 30. The keep-out area 307 extends from the upper surface 301 to the lower surface 302 in a direction perpendicular to the upper surface 301, and a part of the circuit board 30 locates in the keep-out area 307. The antenna 31 is disposed on the circuit board 30 and locates between the upper surface 301 of the circuit board 30 and the lower surface 302 of the circuit board 30. Further, the antenna 31 locates in the keep-out area 307 and is electrically connected to the driving chip 33. The metal piece 32 is disposed on the upper surface 301 of the circuit board 30 and locates in the keep-out area 307. The metal piece 32 is electrically insulated from the antenna 31, and no current can be introduced into the metal piece 32. Further, the metal piece 32 located in the keep-out area 307 is electrically insulated from any conductive wires outside the keep-out area 307 used for introducing current. In the present embodiment, wires outside the keep-out area 307 used for introducing current are, respectively, the power layer 303, the signal wire layer 304 and the ground layer 305. Therefore, the metal piece 32 is further electrically insulated from the power layer 303, the signal wire layer 304 and the ground layer 305. A projection of the antenna 31 along a direction perpendicular to the upper surface 301 partially overlaps the metal piece 32.

FIG. 6 is a cross sectional view of an antenna module according to a fourth embodiment of the present disclosure. As shown by FIG. 6, the antenna module 4 comprises a circuit board 40, an antenna 41, a metal piece 42 and a driving chip 43. The circuit board 40 comprises an upper surface 401, a lower surface 402, a power layer 403, a signal wire layer 404, a ground layer 405, a plurality of insulating layers 406 and a keep-out area 407.

Specifically, the antenna module 4 of the fourth embodiment is similar to the antenna module 3 of the third embodiment. The difference lies in that, the projection of the antenna 41 along a direction perpendicular to the upper surface 401 does not overlap the metal piece 42. That is, the metal piece 42 and the projection of the antenna 41 along the direction perpendicular to the upper surface 401 are misaligned. The detail structure of the antenna module 4 is described as follow. The upper surface 401 and the lower surface 402 are spaced apart from each other along a direction perpendicular to the upper surface 401, and the power layer 403, the signal wire layer 404 and the ground layer 405 are located between the upper surface 401 and the lower surface 402. The power layer 403, the signal wire layer 404 and the ground layer 405 are respectively located on different layers of the circuit board 40, and the insulating layers 406 are respectively disposed between the different layers of the circuit board 40. The keep-out area 407 extends from the upper surface 401 to the lower surface 402 in a direction perpendicular to the upper surface 401, and a part of the circuit board 40 locates in the keep-out area 407. The antenna 41 is disposed on the circuit board 40 and locates between the upper surface 401 of the circuit board 40 and the lower surface 402 of the circuit board 40. In addition, the antenna 41 locates in the keep-out area 407 and is electrically connected to the driving chip 43. The metal piece 42 is disposed in the upper surface 401 of the circuit board 40 and locates in the keep-out area 407. The metal piece 42 is electrically insulated from the antenna 41, and no current can be introduced into the metal piece 42. Further, the metal piece 42 located in the keep-out area 407 is electrically insulated from any conductive wires outside the keep-out area 407 used for introducing current. In the present embodiment, wires used for introducing current outside the keep-out area 407 are, respectively, the power layer 403, the signal wire layer 404 and the ground layer 405. Therefore, the metal piece 42 is further electrically insulated from the power layer 403, the signal wire layer 404 and the ground layer 405.

Figure 7:
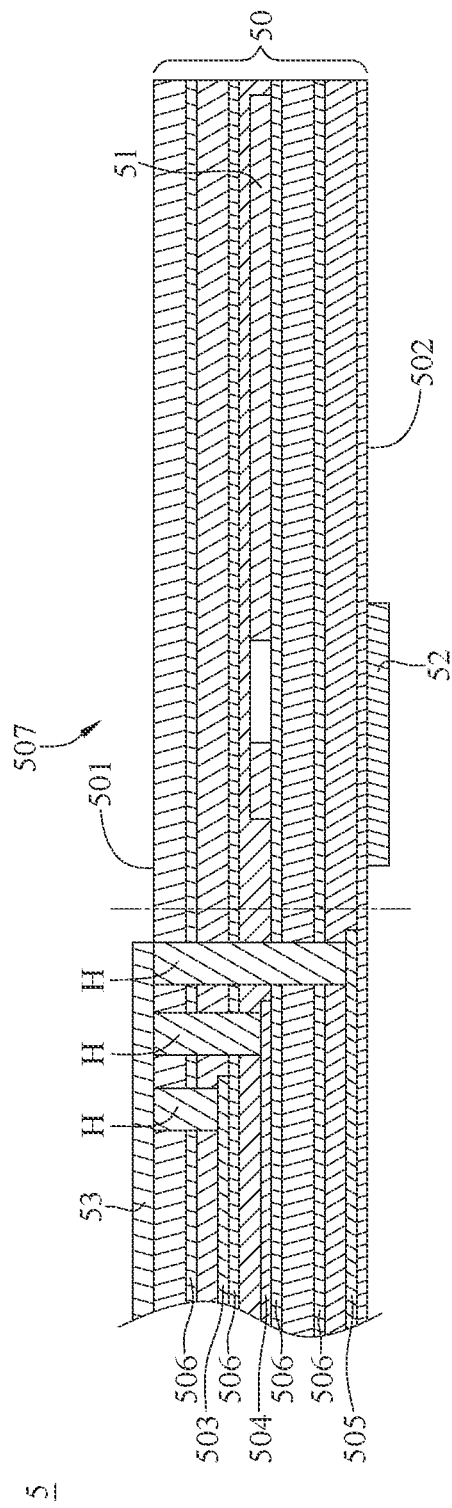
FIG. 7 is a cross sectional view of an antenna module according to a fifth embodiment of the present disclosure.

FIG. 7 is a cross sectional view of an antenna module according to a fifth embodiment of the present disclosure. As shown by FIG. 7, the antenna module 5 comprises a circuit board 50, an antenna 51, a metal piece 52 and a driving chip 53. The circuit board 50 comprises an upper surface 501, a lower surface 502, a power layer 503, a signal wire layer 504, a ground layer 505, a plurality of insulating layers 506 and a keep-out area 507. The upper surface 501 and the lower surface 502 are spaced apart from each other along a direction perpendicular to the upper surface 501, and the power layer 503, the signal wire layer 504 and the ground layer 505 are located between the upper surface 501 and lower surface 502. The power layer 503, the signal wire layer 504 and the ground layer 505 are respectively located on different layers of the circuit board 50, and the insulating layers 506 are respectively disposed between the different layers of the circuit board 50. The keep-out area 507 extends from the upper surface 501 to the lower surface 502 in a direction perpendicular to the upper surface 501, and a part of the circuit board 50 locates in the keep-out area 507. The antenna 51 is disposed in the circuit board 50 and locates between the upper surface 501 of the circuit board 50 and the lower surface 502 of the circuit board 50. Further, the antenna 51 locates in the keep-out area 507 and is electrically connected to the driving chip 53. The metal piece 52 is disposed in the lower surface 502 of the circuit board 50 and located in the keep-out area 507. The metal piece 52 is electrically insulated from the antenna 51, and no current can be introduced into the metal piece 52. Further, the metal piece 52 located in the keep-out area 507 is electrically insulated from any conductive wires outside the keep-out area 507 used for introducing current. In the present embodiment, wires used for introducing current outside the keep-out area 507 are, respectively, the power layer 503, the signal wire layer 504 and the ground layer 505. Therefore, the metal piece 52 is further electrically insulated from the power layer 503, the signal wire layer 504 and the ground layer 505, and the projection of the antenna 51 along a direction perpendicular to the upper surface 501 overlaps the metal piece 52.

Figure 8:
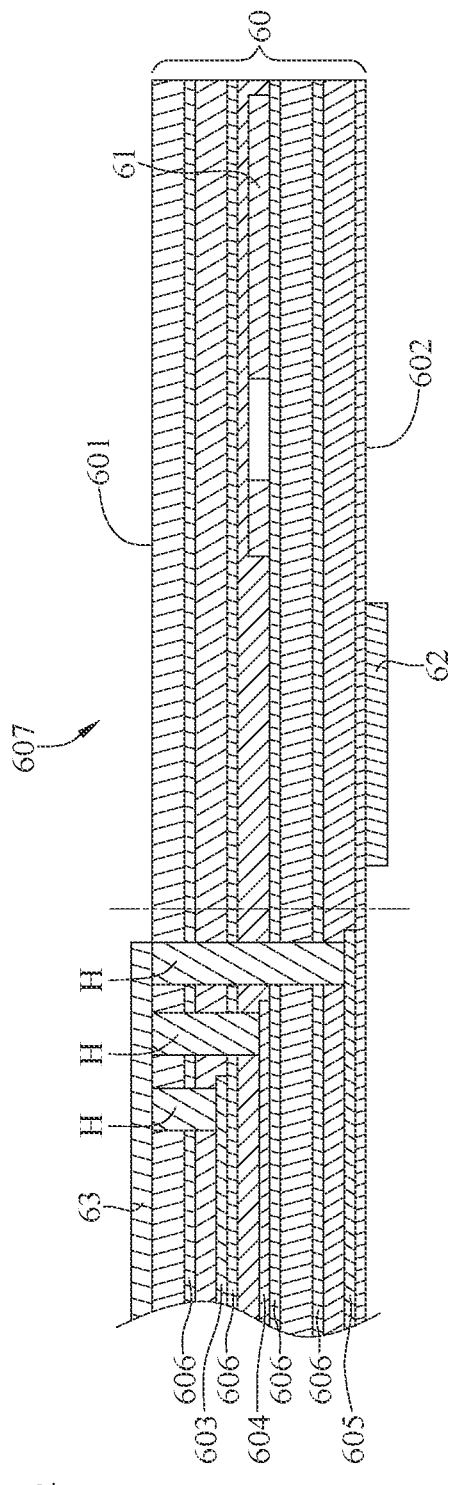
FIG. 8 is a cross sectional view of an antenna module according to a six embodiment of the present disclosure.

FIG. 8 is a cross sectional view of an antenna module according to a six embodiment of the present disclosure. As shown by FIG. 8, the antenna module 6 comprises a circuit board 60, an antenna 61, a metal piece 62 and an antenna driving chip 63. The circuit board 60 comprises an upper surface 601, a lower surface 602, a power layer 603, a signal wire layer 604, a ground layer 605, a plurality of insulating layers 606 and a keep-out area 607.

Specifically, the antenna module 6 of the sixth embodiment is similar to the antenna module 5 of the fifth embodiment. The difference lies in that, the projection of the antenna 61 along a direction perpendicular to the upper surface 601 does not overlap the metal piece 62. That is, the metal piece 62 and the projection of the antenna 61 along the direction perpendicular to the upper surface 601 are misaligned. The detail structure of the antenna module 6 is described as follow. The upper surface 601 and the lower surface 602 are spaced apart from each other along a direction perpendicular to the upper surface 601. The power layer 603, the signal wire layer 604 and the ground layer 605 are located between the upper surface 601 and the lower surface 602. The power layer 603, the signal wire layer 604 and the ground layer 605 are respectively located on different layers of the circuit board 60, and the insulating layers 606 are respectively disposed between the different layers of the circuit board 60. The keep-out area 607 extends from the upper surface 601 to the lower surface 602 in a direction perpendicular to the upper surface 601, and a part of the circuit board 60 locates in the keep-out area 607. The antenna 61 is disposed on the circuit board 60 and locates between the upper surface 601 of the circuit board 60 and the lower surface 602 of the circuit board 60. In addition, the antenna 61 locates in the keep-out area 607 and is electrically connected to the driving chip 63. The metal piece 62 is disposed in the lower surface 602 of the circuit board 60 and locates in the keep-out area 607. The metal piece 62 is electrically insulated from the antenna 61, and no current can be introduced into the metal piece 62. Further, the metal piece 62 located in the keep-out area 607 is electrically insulated from any conductive wires outside the keep-out area 607 used for introducing current. In the present embodiment, wires used for introducing current outside the keep-out area 607 are, respectively, the power layer 603, the signal wire layer 604 and the ground layer 605. Therefore, the metal piece 62 is further electrically insulated from the power layer 603, the signal wire layer 604 and the ground layer 605.

In other embodiments, the metal piece located in the keep-out area may also be disposed between the upper surface and the lower surface of the circuit board, as long as the antenna and the metal piece are located on different layers of the circuit board.

Figure 9:
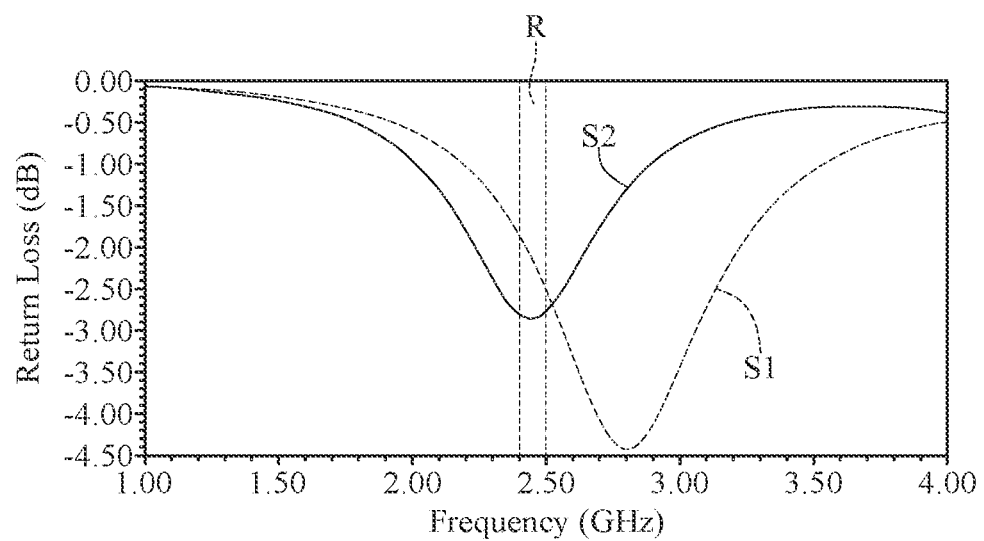
FIG. 9 is a comparison between the transmission efficiencies of an antenna module according to an embodiment of the present disclosure and a known antenna module.

FIG. 9 is a comparison between the transmission efficiencies of an antenna module according to an embodiment of the present disclosure and a known antenna module. As shown by FIG. 9, curve S1 represents the transmission efficiency of a known antenna module, and curve S2 represents the transmission efficiency of the antenna module according to an embodiment of the present disclosure. The two different antenna modules are both Bluetooth antenna modules. The vertical axis defines return loss, the horizontal axis defines frequency (GHz), and region R is a frequency band that Bluetooth may apply. Since Bluetooth antenna module has to be able to transmit and receive signals normally, the return loss of the frequency band that Bluetooth may apply has to be lower than a threshold, for example, −2.5 db. The known antenna module may generate a frequency band drift due to a bending of the antenna. Therefore, the return loss of curve S1 in the region R is higher than −2.5 db, resulting in signals not being properly transmitted and received. The antenna module according to an embodiment of the present disclosure may allow the return loss of curve S2 in the region R being lower than −2.5 db by adjusting the size of the metal piece (for example, adjusting the length/width of the metal piece. Therefore, the problem of frequency drift is obviously eased, and the Bluetooth antenna module may transmit and receive signals normally.

The problem of frequency band drifting occurs easily when the antenna module is bent due to external forces. The conventional way of solving the problem is to redesign the pattern of the antenna. However, since different users have different curvatures at different body parts, it is impossible to redesign the antenna pattern for each individual. Accordingly, the antenna module provided by the present disclosure may efficiently ease the problem of frequency band drifting by adjusting the length/width of the metal piece disposed in the keep-out area without changing the antenna pattern. Therefore, the antenna module may transmit and receive signals normally, thereby improving the transmission efficiency of the antenna module.

What is claimed is:

1. An antenna module, comprising:
   a circuit board, having a three-dimensional keep-out area, and having an upper surface and a lower surface opposite to each other, wherein the three-dimensional keep-out area is a up and down direction area of the circuit board, which is a normal direction area of the circuit board;
   a metal piece, directly attached to one of the upper surface and the lower surface of the circuit board, and located in the keep-out area; and
   an antenna, disposed on the circuit board and only located in the keep-out area, and directly attached to the other one of the upper surface and the lower surface of the circuit board, or disposed between the upper surface and the lower surface,
   wherein the metal piece is electrically insulated from the antenna, and the keep-out area is not arranged with any wire for conducting electric current except for the antenna.

2. The antenna module according to claim 1, wherein the antenna is formed on a printed circuit board.

3. The antenna module according to claim 1, wherein the metal piece is electrically insulated from all conductive wires located outside the keep-out area.

4. The antenna module according to claim 1, wherein the keep-out area extends from the upper surface to the lower surface in a direction perpendicular to the upper surface, and the antenna and the metal piece are respectively disposed on the upper surface and the lower surface of the circuit board.

5. The antenna module according to claim 1, wherein the circuit board is a flexible printed circuit board.

6. The antenna module according to claim 1, wherein a shape of a projection of the keep-out area on the upper surface or the lower surface of the circuit board is rectangular.

7. The antenna module according to claim 1, wherein the antenna is located between the upper surface and the lower surface, the keep-out area extends from the upper surface to the lower surface in a direction perpendicular to the upper surface, and the metal piece is disposed on the upper surface.

8. The antenna module according to claim 1, wherein the antenna is located between the upper surface and the lower surface, the keep-out area extends from the upper surface to the lower surface in a direction perpendicular to the upper surface, and the metal piece is disposed on the lower surface.

9. The antenna module according to claim 1, wherein a projection of the antenna in a direction perpendicular to the upper surface of the circuit board at least partially overlaps the metal piece.

10. The antenna module according to claim 1, wherein a projection of the antenna in a direction perpendicular to the upper surface of the circuit board does not overlap the metal piece.

* * * * *